(12) United States Patent
Dubey

(10) Patent No.: US 7,284,174 B2
(45) Date of Patent: Oct. 16, 2007

(54) ENHANCED JTAG INTERFACE

(75) Inventor: Rohit Dubey, Allahabad (IN)

(73) Assignee: STMicroelectronics Pvt Ltd., Uttar Pradesh (IN)

( * ) Notice: Subject to any disclaimer, the term of this patent is extended or adjusted under 35 U.S.C. 154(b) by 165 days.

(21) Appl. No.: 11/024,574

(22) Filed: Dec. 29, 2004

(65) Prior Publication Data
US 2005/0166109 A1 Jul. 28, 2005

(30) Foreign Application Priority Data
Dec. 30, 2003 (IN) ........................ 1644/DEL/2003

(51) Int. Cl.
G01R 31/317 (2006.01)
G01R 31/316 (2006.01)

(52) U.S. Cl. ...................... 714/727; 714/729

(58) Field of Classification Search ................ 714/727, 714/726, 742, 25, 45, 724
See application file for complete search history.

(56) References Cited
U.S. PATENT DOCUMENTS
6,567,943 B1 * 5/2003 Barnhart et al. ............ 714/727
6,681,359 B1 * 1/2004 Au et al. ..................... 714/733
7,007,099 B1 * 2/2006 Donati et al. ............... 709/237

* cited by examiner

Primary Examiner—Guy Lamarre
Assistant Examiner—Dipakkumar Gandhi
(74) Attorney, Agent, or Firm—Lisa K. Jorgenson; Allen, Dyer, Doppelt, Milbrath & Gilchrist, P.A.

(57) ABSTRACT

An enhanced JTAG interface provides an additional clock output at any desired I/O port of a logic device during normal operation. The interface includes a boundary scan data cell associated with each I/O port that enables either input data to the I/O port in a normal mode or routes the boundary scan input data during a JTAG operation. A control cell is associated with each data cell for selectively enabling either a normal mode or a JTAG mode of the boundary scan cell. A set of JTAG instructions enable/disable JTAG operation and select JTAG functions. The boundary scan data cell is modified to incorporate a multiplexing arrangement to selectively route the JTAG clock to the I/O port when required. The control cell is modified to selectively enable/disable the routing of the JTAG clock in the boundary scan data cell.

13 Claims, 5 Drawing Sheets

US 7,284,174 B2

ENHANCED JTAG INTERFACE

FIELD OF THE INVENTION

The invention relates to a Joint Test Action Group (JTAG) interface, and in particular, to an enhanced JTAG interface that provides a clock output to any desired I/O port of a logic device during normal operation.

BACKGROUND OF THE INVENTION

Boundary scan testing is well known, and uses a plurality of shift registers that are built into each integrated circuit. A boundary scan controller circuit is incorporated into each integrated circuit to control the transfer of data serially from one register to another. An important advantage of boundary scan testing is that it allows testing of internal logic circuitry to be conducted from external terminals. This does away with the need for probes and other instrumentation.

By way of example, a primary use of boundary scan cell designs is for circuit continuity testing. Circuit continuity testing involves loading a value into a register, and then applying a certain voltage condition to the associated pad to determine if an open or short circuit exists.

An industry standard has been implemented for boundary scan test circuits so that integrated circuits from different manufacturers may be connected in a serial chain within an electronic system. This standard is described in an industry specification, known as the IEEE JTAG 1149.1 standard. The standard provides a protocol by which various test functions may be accomplished. For example, in a JTAG scan, test circuitry and five additional JTAG test pins are added to each chip.

The standard outlines the details of the serial path of linked test registers (i.e., a boundary scan register chain) through each integrated circuit. The standard also defines the properties of a boundary scan controller circuit for each integrated circuit. The boundary scan controller circuit controls the transfer of data through the various stages of shift registers formed by the boundary scan cells within the integrated circuit.

FIG. 1 depicts a prior-art IEEE 1149.1 compliant device architecture referred to as boundary-scan architecture 310. The boundary-scan architecture 310 includes a Test Access Port (TAP) 300, a TAP Controller 200, an instruction register 260, an instruction decode logic 250, a data register bank 240, and an output stage comprising a multiplexer 270, a flip-flop 280 and a tristate buffer 290. Although the instruction decode logic 250 is shown as being separate from the instruction register 260, the instruction decode logic 250 may also be considered to be part of the instruction register 260.

A data register bank 240 includes the boundary-scan register 220 as described above, and a bypass register 210. The bypass register 210 is a single bit shift register not associated with the IC core logic (memory latches) or I/O pins. Its purpose is to provide an alternate serial path between the TDI and TDO pins of a JTAG-compliant device. As will be described below, only one of the registers in the data bank 240 forms the serial path between TDI and TDO at any given time.

The TAP 300 is the interface between the boundary-scan architecture 310 and the five IC device pins required by IEEE 1149.1. The five IC device pins are as follows: a test data in (TDI) pin and a test data out (TDO) pin, a test clock (TCK) pin, a test mode select (TMS) pin and an optional test reset (TRST) pin. During operation, a series of commands are issued through the test pins to read back data and to verify whether interconnects have been established properly.

FIG. 2 is an illustration of a typical, conventional IEEE JTAG implementation. The logic circuit includes a multiplexer 11 that selects data to be coupled to a JTAG output capture register 12 from either the core logic circuitry of the IC or from the previous scan stage. The selection is controlled by a shift/capture signal from a JTAG control logic coupled to the multiplexer 11. The capture register 12 may either be loaded externally from one of the five JTAG pins, or may comprise capture data from one of the previous test clock cycles.

The shift/capture signal enables either capture of data directly from the core logic that is normally provided to an output buffer 15, or if switched to another mode, allows the previous scan stage to be input to the capture register 12. This latter operation typically involves shifting all of the register stages of the boundary scan cell in a daisy chain fashion. The JTAG data input pin is connected to the input of the first element in the daisy chain, and the output of last element in the chain is connected to the JTAG output pin.

When the JTAG circuitry is connected in this manner, and all the registers are filled with some value, all the values may be shifted from one stage to the next until the circuitry is in a desired position. Once the shifting operation has been completed and the circuit is in a desired state, an update register 13 coupled to the capture register 12 may be used to properly align and present the data to an output buffer 15.

The output of the update register 13 is coupled to one of the inputs of a multiplexer 14. The other input of the multiplexer 14 is coupled to receive data directly from the core logic of the integrated circuit. A JTAG mode signal, which is provided from the JTAG controller, is used to select either the captured data stored in the update register 13, or the core data directly as the input to the output buffer 15. The output buffer 15 is an ordinary buffer circuit (inverter) used to drive a data signal to a pad 20. An output enable signal line 16 enables the output buffer 15.

An input buffer 25 is utilized to drive the voltage signal present at the pad 20 to either the core logic of the IC via a multiplexer 21, or to an input capture register 23 via a multiplexer 24. The multiplexer 24 selects between the output of the input buffer 25, or the previous scan stage data captured in the capture register 12. The selection is controlled by the shift/capture signal. The output of the multiplexer 24 provides the input signal to the JTAG input capture register 23. The output of the capture register 23 is provided to the update register 22, which in turn presents the captured input data back to the core logic via the multiplexer 21. As in the case with the multiplexer 14, the multiplexer 21 is controlled by the JTAG mode signal.

Signal 16 is the output of the multiplexer 34, which selects between captured data from the control update register 33. The input of the control update register 33 comes from a control capture register 32. The control capture register 32 selects between a tristate signal from the core, or data from a previous scan stage through a multiplexer 31. The multiplexer 31 is controlled by a shift/capture signal, as in the case with the multiplexers 11 and 24.

A major drawback of the existing circuitry, which is used for testing purposes, is that it is unused most of the time when a device operates in a normal mode.

SUMMARY OF THE INVENTION

An object of the present invention is to provide an enhanced JTAG interface that uses a JTAG test clock to produce a clock at any bi-directional pin of a programmable device when the JTAG logic is not being used or the programmable device is operating in a normal mode.

Another object of the invention is to provide an extra clock with a lower frequency.

To achieve these objectives, the present invention provides an enhanced JTAG interface providing an additional clock output at any desired I/O port of a logic device during normal operation. The interface may comprise a boundary scan data cell associated with each I/O port that enables either input data to an I/O port in a normal mode or routes the boundary scan input data during JTAG operation.

A control cell may be associated with each data cell for selectively enabling either a normal mode or a JTAG mode of the boundary scan cell. A set of JTAG instructions is provided for enabling/disabling JTAG operation and for selecting JTAG functions. The boundary scan data cell may be modified by incorporating a multiplexing arrangement to selectively route the JTAG clock to the I/O port when required.

The control cell may be modified by selectively enabling/disabling the routing of the JTAG clock in the boundary scan data cell. The JTAG instruction set may be enhanced by incorporating instructions to select the desired I/O port and to enable the routing.

The multiplexing arrangement is a standard multiplexer with associated logic gates. The standard logic gates may achieve selective enabling/disabling. The incorporated instructions may include Clock/Data and JTAG_CLOCK.

The present invention further provides a JTAG-enabled logic device incorporating the ability of routing the JTAG clock to any desired I/O port during normal operation. The device may comprise a boundary scan data cell associated with each I/O port that enables either input data to the I/O port in a normal mode, or routes the boundary scan input data during JTAG operation. A control cell may be associated with each data cell for selectively enabling either a normal mode or a JTAG mode of the boundary scan cell.

The device may further comprise a set of JTAG instructions for enabling/disabling JTAG operation and for selecting JTAG functions. The boundary scan data cell may be modified by incorporating a multiplexing arrangement to selectively route the JTAG clock to the I/O port when required. The control cell may be modified by selectively enabling/disabling the routing of the JTAG clock in the boundary scan data cell. The JTAG instruction set may be enhanced by incorporating additional instructions to select the desired I/O port and to enable the routing.

The boundary scan logic is thus used as a source for the clock signal. Any I/O pin of an integrated circuit device can be converted to a clock source. The clock signal may be directed internal the device to the core or external the device on the board. While the clock signals are active from a defined boundary scan cell, other pins may be configured as input or output pins or they also may be in HIGHZ or CLAMP like position. An extra clock signal may be very much useful in programmable devices, where an extra clock at a lower frequency may be required.

The invention also provides a method for enabling selective routing of the JTAG test clock to any desired I/O port of any logic device incorporating the JTAG interface during normal operation. The method may comprise modifying the data cell of the boundary scan JTAG circuitry to selectively enable/disable the input scan data or the JTAG clock to disable the I/O port, and modifying the control cell of the boundary scan circuitry to enable/disable the scan data in.

The method may further comprise incorporating additional JTAG instructions to invoke selective routing of the clock to select the desired I/O port, and to enable the clock on the I/O port. The modification of the data cell may comprise multiplexing the input scan data and the inverted value of the last latch, gating the instructions to enable/disable the flow of data, and deciding the clock mode or normal mode of operation depending upon the logic level of the instruction.

BRIEF DESCRIPTION OF THE DRAWINGS

The present invention will now be described with reference to the accompanying drawings.

DETAILED DESCRIPTION OF THE PREFERRED EMBODIMENTS

Figure 1:
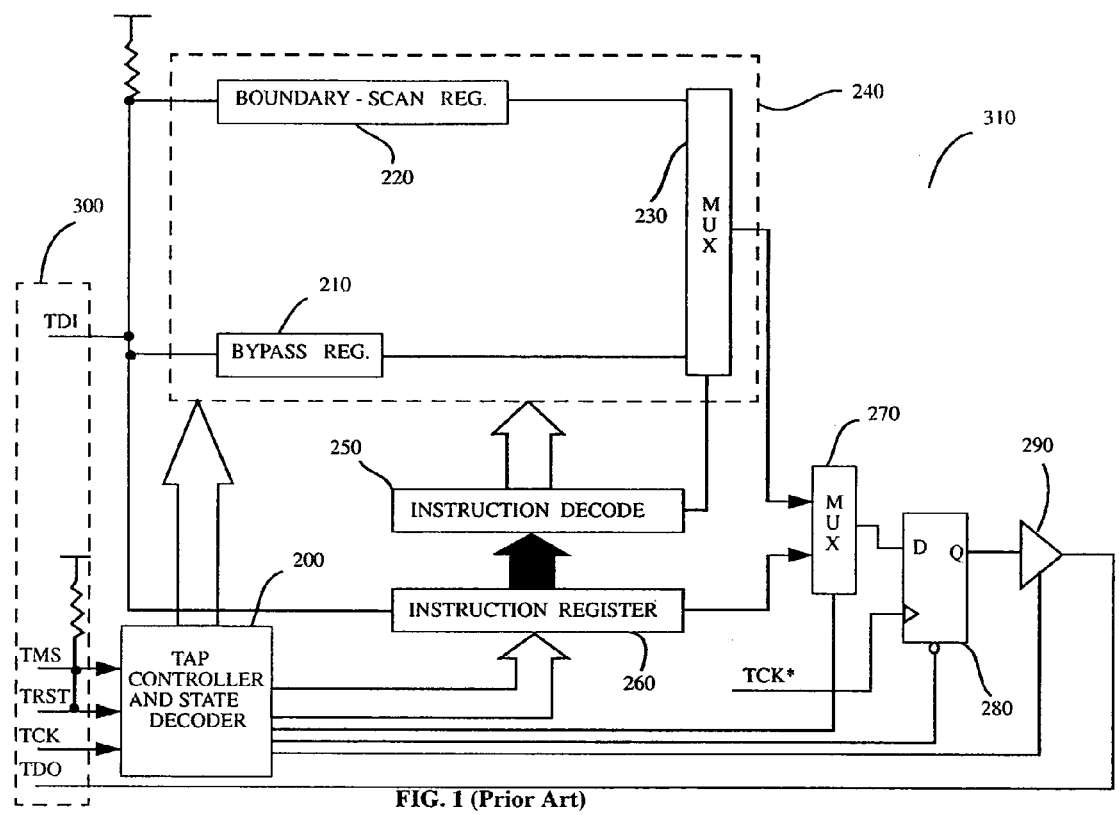
FIG. 1 is a block diagram of an IC device including a boundary-scan register according to the prior art.
Figure 2:
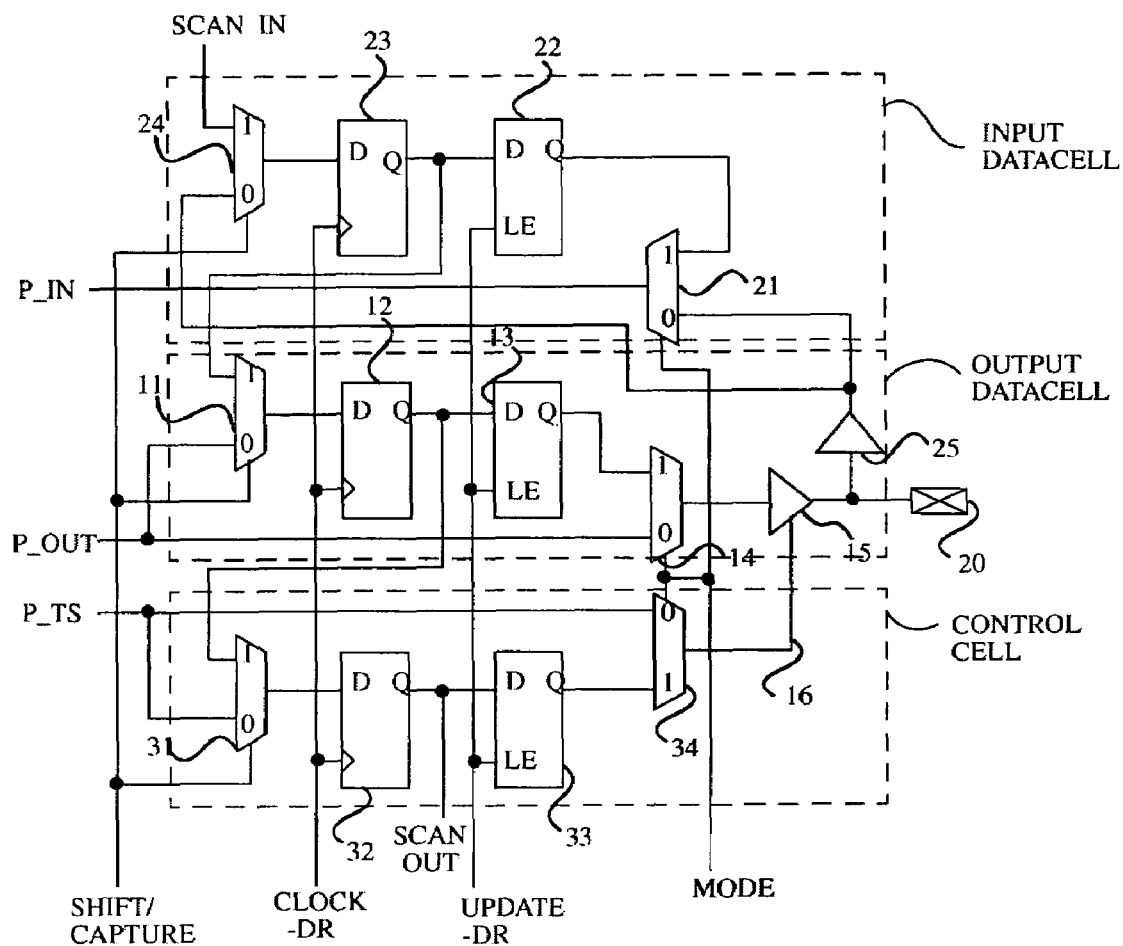
FIG. 2 is a block diagram of a bi-directional boundary scan cell according to the prior art.
Figure 3:
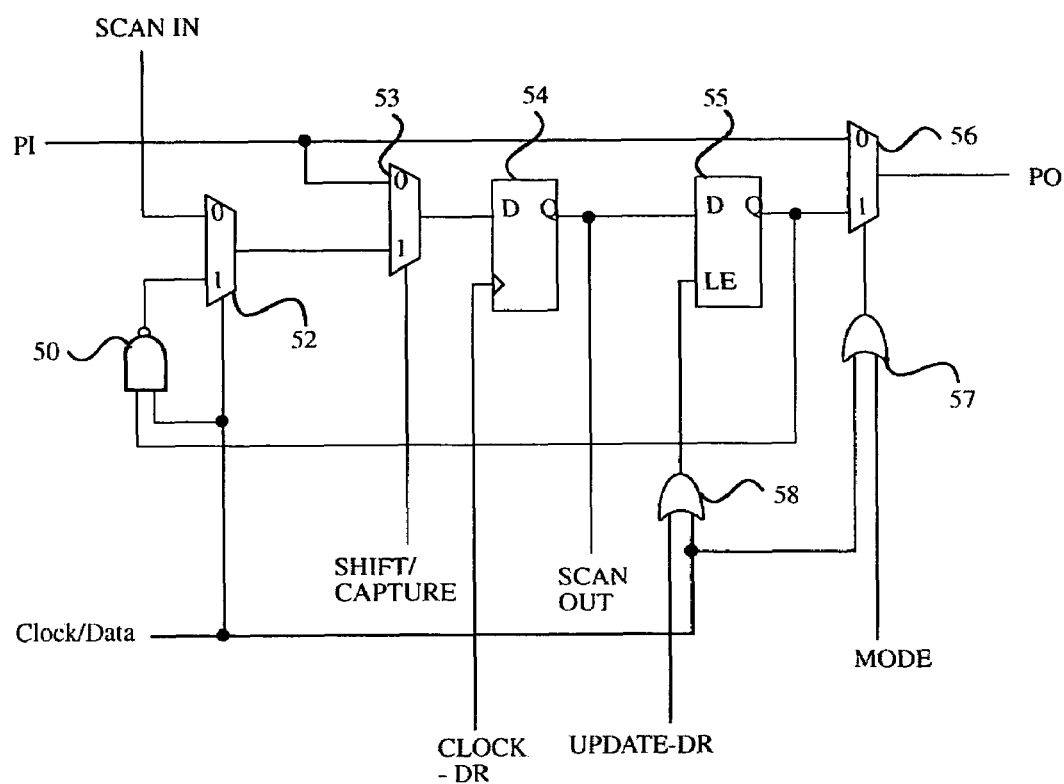
FIG. 3 is a block diagram of a modified data cell according to present invention.

FIG. 3 is a modified data cell according to the present invention. The data cell includes multiplexers 53, 56 and flip-flops 54, 55 as in the prior art data cells. However, a multiplexer 52, a NAND gate 50 and two OR gates 57, 58 have been added in accordance with the present invention. A new Clock/Data signal has been added, which is coming from the modified control cell illustrated in FIG. 4.

The multiplexer 56 can now be controlled by two signals. The Clock/Data signal is an added signal in addition to the MODE signal. If the MODE signal or the Clock/Data signal is a logic 1, then the multiplexer 56 would select latched data from the latch 55. Otherwise, the multiplexer 56 selects the parallel input PI. The latch 55 is again controlled by two signals, Clock/Data and UPDATE-DR. If any one of these signals is a logic 1, then the latch 55 would be enabled.

Flip-flop 54 is not modified. The flip-flop 54 is controlled by a CLOCK-DR signal and it captures data from the multiplexer 53. The multiplexer 53 is controlled by the SHIFT/CAPTURE signal. If the SHIFT/CAPTURE signal is a logic 0, it would select the parallel input PI as usual but if this signal is high, the multiplexer 53 selects data from a newly added multiplexer 52, which is controlled by the Clock/Data signal. During the high level of the Clock/Data signal, the multiplexer 52 will select an inverted value of the latch 55 through the NAND gate 50. If the Clock/Data signal is high, then the present modified data cell will act as a clock cell with a frequency half that of the CLOCK-DR signal because at every positive edge of the CLOCK-DR signal the output PO will be inverted.

Figure 4:
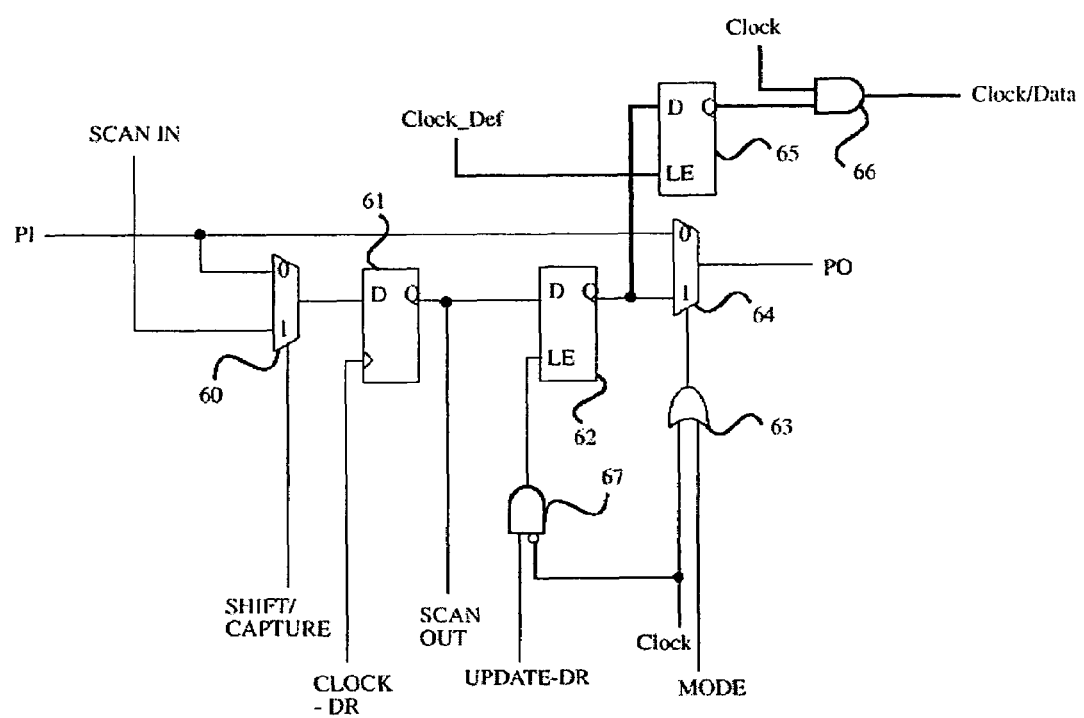
FIG. 4 is a block diagram of a modified control cell according to present invention.

FIG. 4 is depicting a modified control cell of the present invention. The modified control cell comprises two latches 62, 65, one OR gate 63, and two AND gates 66, 67 in addition to components present in the prior art control cell. A multiplexer 60 is controlled by a SHIFT/CAPTURE signal, which selects serial input SCAN IN if high, and parallel input PI if low. A flip-flop 61 is clocked by a clock CLOCK-DR and captures data from the multiplexer 60. Output of the flip-flop 61 goes to the next I/O as well as to the latch 62. The latch 62 is controlled by the output of the gate 67, which has two inputs UPDATE-DR and Clock.

A clock signal is generated when a new instruction JTAG_CLOCK is loaded in the instruction register and allows the boundary scan cells to operate as a clock. If the clock signal is a logic 1, the latch 62 will be disabled and previous data stored in the latch 62 will be present on the parallel output PO through the multiplexer 64. At the same time, the gate 66 will pass the information on a Clock/Data signal.

Latch 65 is controlled by a Clock_Def signal, which is generated by loading a newly added instruction DEFINE_CLOCK. The Clock_Def signal decides whether a particular I/O pin should operate as a clock or as a normal BIDI pin. If the Clock_Def signal is high, it enables the latch 65 and the data loaded in the latch 62 is passed onto the gate 66, which can further cross the gate 66 only if the clock signal is high. The content of the latch 62 is responsible for the data cell to operate as a clock cell or a normal data cell. The Clock_Def signal is going to the new data cell illustrated in FIG. 3, and operation of the Clock_Def signal is also explained above.

Figure 5:
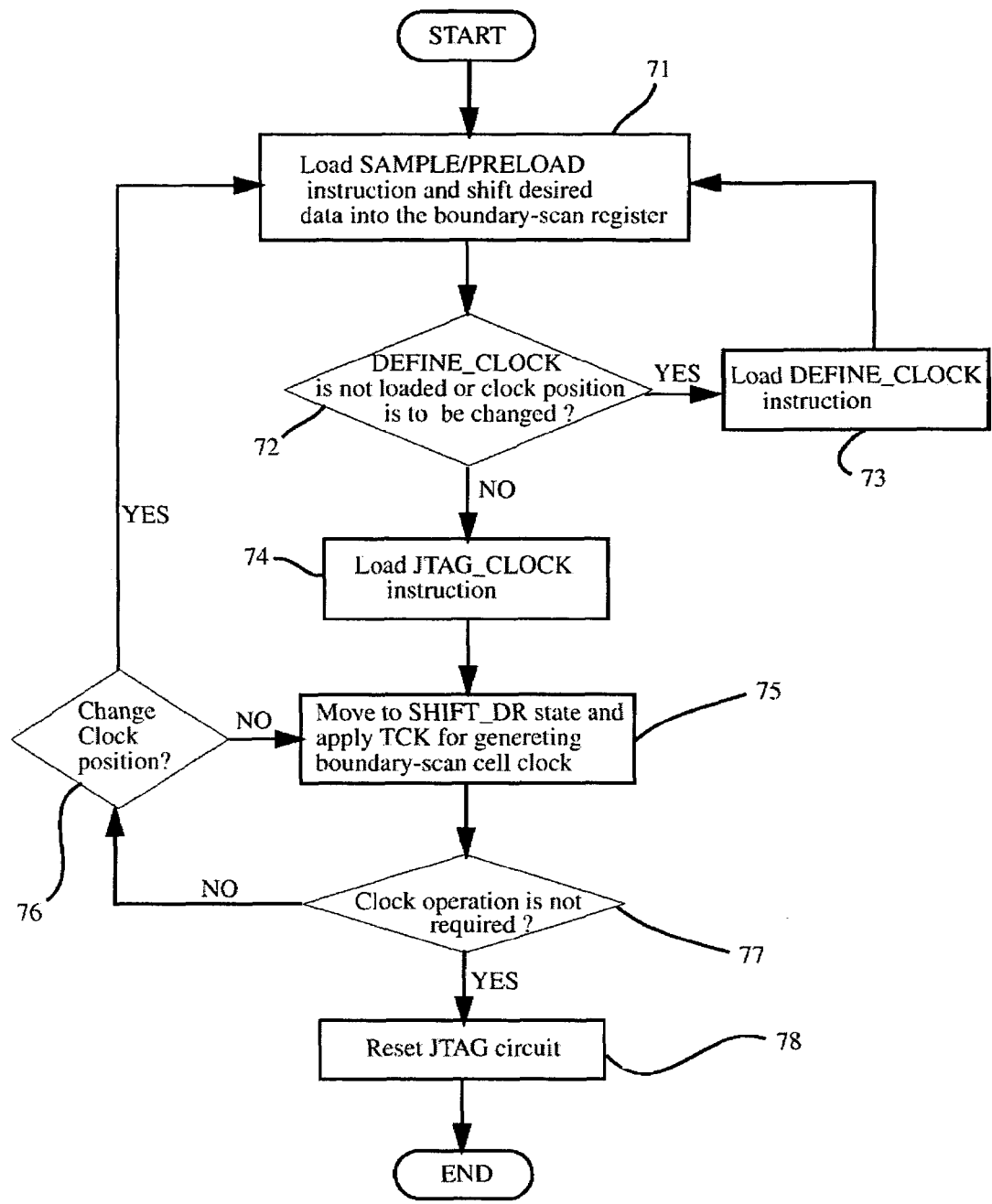
FIG. 5 is flow chart describing a method for enabling selective routing of a JTAG test clock according to the present invention.

FIG. 5 describes the functioning of the present invention when the JTAG circuit is not being used and an IC is operating in a normal mode. At a first step 71, a SAMPLE/PRE-LOAD instruction is loaded in the instruction register, and then the desired data is loaded in the boundary scan register, which is going to decide any bi-directional pin as an input, an output or a clock pin.

Step 72 decides whether data loaded in the boundary scan register in step 71 was for defining the clock or for defining the direction of the bi-directional pins. If in step 71 the data loaded in the boundary scan is for deciding a clock pin, then the next step after step 72 will be step 73. Otherwise, the next step would be step 74. In step 73, a DEFINE_CLOCK instruction is loaded in the instruction register while in step 74 a JTAG_CLOCK instruction is loaded into the instruction register. The DEFINE_CLOCK instruction is a prerequisite for the JTAG_CLOCK instruction because the clock pin should be clearly specified before starting the clock.

In step 75, the JTAG is moved to its SHIFT_DR state and will remain there with changing TCK as long as the clock is required for the boundary scan clock cell. Step 77 decides whether the clock is further needed or not. If the clock is needed, then any change in the position of the clock may be required and is decided in step 76. If a change in the position of the clock is required, then again the process starts from step 71, otherwise it remains in step 75. If the clock operation is not needed in step 78, the JTAG logic is reset and the JTAG is available for its normal operation.

That which is claimed is:

1. A Joint Test Action Group (JTAG) interface for a logic device comprising a plurality of input/output (I/O) ports, the JTAG interface comprising:
a respective boundary scan data cell coupled to each I/O port of the logic device for selectively routing input data to the I/O port during a normal mode of operation and boundary scan input data during a JTAG mode of operation, each boundary scan data cell comprising a multiplexing arrangement for selectively routing a JTAG clock signal to the respective I/O port during the normal mode of operation; and
a control cell associated with each boundary scan data cell to selectively enable the normal mode of operation and the JTAG mode of operation, each control cell also selectively enabling/disabling routing of the JTAG clock signal in a respective boundary scan data cell;
each boundary scan data cell and associated control cell being responsive to a set of JTAG instructions for selecting a respective I/O port for routing of the JTAG clock signal thereto.

2. A JTAG interface according to claim 1 wherein said multiplexing arrangement comprises a multiplexer and a plurality of logic gates associated therewith.

3. A JTAG interface according to claim 1 wherein said control cell comprises a plurality of logic gates for selectively enabling/disabling the routing.

4. A JTAG interface according to claim 1 wherein the JTAG instructions comprise a Clock/Data signal and a JTAG_CLOCK signal.

5. A Joint Test Action Group (JTAG) enabled logic device comprising:
a plurality of input/output (I/O) ports;
a plurality of boundary scan data cells coupled to said plurality of I/O ports, each respective boundary scan data cell coupled to an I/O port for selectively routing input data to the I/O port during a normal mode of operation and boundary scan input data during a JTAG mode of operation, each boundary scan data cell comprising a multiplexing arrangement for selectively routing a JTAG clock signal to the respective I/O port during the normal mode of operation; and
a plurality of control cells coupled to said plurality of boundary scan data cells, each control cell associated with a respective boundary scan data cell to selectively enable the normal mode of operation and the JTAG mode of operation, each control cell also selectively enabling/disabling routing of the JTAG clock signal in the respective boundary scan data cell;
each boundary scan data cell and associated control cell being responsive to a set of JTAG instructions for selecting a respective I/O port for routing of the JTAG clock signal thereto.

6. A JTAG enabled logic device according to claim 5 wherein said multiplexing arrangement comprises a multiplexer and a plurality of logic gates associated therewith.

7. A JTAG enabled logic device according to claim 5 wherein each control cell comprises a plurality of logic gates for selectively enabling/disabling the routing.

8. A JTAG enabled logic device according to claim 5 wherein the JTAG instructions comprise a Clock/Data signal and a JTAG_CLOCK signal.

9. A method for enabling selective routing of a Joint Test Action Group (JTAG) clock signal to a selected input/output (I/O) port of a logic device comprising a JTAG interface, the JTAG interface comprising a respective boundary scan data cell coupled to each I/O port of the logic device; and a control cell associated with each boundary scan data cell; and each boundary scan data cell and associated control cell being responsive to a set of JTAG instructions, the method comprising:
selecting an I/O port based upon the set of JTAG instructions for routing of the JTAG clock signal thereto;
selectively routing input data to the selected I/O port during a normal mode of operation and boundary scan input data during a JTAG mode of operation, each boundary scan data cell comprising a multiplexing arrangement for selectively routing the JTAG clock signal to the respective I/O port during the normal mode of operation; and
selectively enabling the normal mode of operation and the JTAG mode of operation via a control cell associated with a respective boundary scan data cell, each control cell also selectively enabling/disabling routing of the JTAG clock signal in the respective boundary scan data cell.

10. A method according to claim 9 wherein each boundary scan data cell comprises a plurality of logic gates for selectively routing the input data to the I/O port coupled thereto during the normal mode of operation or boundary scan input data during the JTAG mode of operation.

11. A method according to claim 9 wherein each control cell comprises a plurality of logic gates for selectively enabling/disabling the routing.

12. A method according to claim 9 wherein the JTAG instructions comprise a Clock/Data signal and a JTAG_CLOCK signal.

13. A method according to claim 9 wherein routing the input data in each boundary scan data cell comprises:

multiplexing the input data;

gating the JTAG instructions to enable/disable flow of the input data within the boundary scan data cell; and determining whether the clock signal is to be provided to the I/O port based upon a logic level of the JTAG instructions.

* * * * *